(12) United States Patent
Tsubouchi et al.

(10) Patent No.: US 9,924,606 B2
(45) Date of Patent: Mar. 20, 2018

(54) ELECTRICAL CONNECTION BOX AND WIRE HARNESS

(71) Applicant: Yazaki Corporation, Tokyo (JP)

(72) Inventors: Tatsuya Tsubouchi, Shizuoka (JP);
Takahiko Mitsui, Shizuoka (JP);
Yosuke Fukuhara, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/413,613

(22) Filed: Jan. 24, 2017

(65) Prior Publication Data
US 2017/0215291 A1 Jul. 27, 2017

(30) Foreign Application Priority Data

Jan. 25, 2016 (JP) ................................. 2016-011321

(51) Int. Cl.
| | | |
|---|---|---|
| H02B 1/20 | (2006.01) | |
| H05K 5/02 | (2006.01) | |
| H01B 7/00 | (2006.01) | |
| H05K 5/03 | (2006.01) | |
| B60R 16/023 | (2006.01) | |
| H02G 3/08 | (2006.01) | |

(52) U.S. Cl.
CPC ....... *H05K 5/0217* (2013.01); *B60R 16/0238* (2013.01); *H01B 7/0045* (2013.01); *H05K 5/0247* (2013.01); *H05K 5/03* (2013.01); *H02G 3/086* (2013.01)

(58) Field of Classification Search
CPC ...... H05K 5/0217; H05K 5/0247; H05K 5/03; H01B 7/0045

USPC .......................... 361/728–730, 752, 825–826
See application file for complete search history.

(56) References Cited

U.S. PATENT DOCUMENTS

| | | | | |
|---|---|---|---|---|
| 6,196,882 B1 * | 3/2001 | Sato | ..................... | H01R 9/2408 174/50 |
| 6,561,822 B2 * | 5/2003 | Depp | ..................... | H05K 7/026 439/521 |
| 6,570,088 B1 * | 5/2003 | Depp | ................... | B60R 16/0238 174/50 |

(Continued)

FOREIGN PATENT DOCUMENTS

| | | |
|---|---|---|
| JP | 2882313 B2 | 4/1999 |
| JP | 2001-186629 A | 7/2001 |
| JP | 2013-223367 A | 10/2013 |

*Primary Examiner* — Hung S Bui
(74) *Attorney, Agent, or Firm* — Kenealy Vaidya LLP (57) ABSTRACT

Included are a housing that includes a housing chamber of an electronic component and from which electrical wires are drawn out to the outside when the electrical wires are electrically connected to the electronic component, and at least one retaining mechanism that is provided between a retaining wall out of a plurality of walls composing the housing chamber and the electronic component or a retaining member of the electronic component, and makes the housing chamber retain the electronic component or the retaining member. The housing includes a main component in which at least one housing chamber communicating with respective openings at both ends is formed. The retaining wall is made to warp toward the housing chamber side as compared with when the electronic component is in an accommodated state.

7 Claims, 6 Drawing Sheets

(56) References Cited

U.S. PATENT DOCUMENTS

| | | | |
|---|---|---|---|
| 6,679,708 B1 * | 1/2004 | Depp | H01R 9/2466 |
| | | | 361/752 |
| 6,773,271 B2 * | 8/2004 | Falchetti | H01H 85/2045 |
| | | | 439/701 |
| 9,466,922 B2 * | 10/2016 | Kakoi | B60R 16/0238 |
| 2013/0280952 A1 | 10/2013 | Saimoto et al. | |
| 2017/0214183 A1 * | 7/2017 | Fukuhara | H01B 7/0045 |

* cited by examiner

FIG.5

ELECTRICAL CONNECTION BOX AND WIRE HARNESS

CROSS-REFERENCE TO RELATED APPLICATION(S)

The present application claims priority to and incorporates by reference the entire contents of Japanese Patent Application No. 2016-011321 filed in Japan on Jan. 25, 2016.

BACKGROUND OF THE INVENTION

1. Field of the Invention

The present invention relates to an electrical connection box and a wire harness.

2. Description of the Related Art

Conventionally known have been an electrical connection box in which electronic components are accommodated in a housing chamber in the inside of a housing and in which the electronic components and electrical wires are electrically connected in the housing chamber, and a wire harness that includes the electrical connection box (Japanese Patent Application Laid-open No. 2001-186629 and Japanese Patent Application Laid-open No. 2013-223367). The electrical wires are drawn out from the inside of the housing to the outside and are electrically connected to certain connection target objects. For example, the electrical connection box or the wire harness is installed in a vehicle and, by being interposed between a power source of the vehicle and a load thereof, can yield the electrical connection between them. In the electrical connection box, a retaining mechanism that directly or indirectly retains the electronic components in the housing chamber is provided (JP-A-2013-223367). The retaining mechanism includes engaging bodies provided on each of the housing chamber and the electronic component side and, by making the engaging bodies engage with each other, directly or indirectly retains the electronic components in the housing chamber.

Meanwhile, in such a retaining mechanism of the foregoing example, in order to ensure an engaged state of the engaging bodies (in other words, the connection strength between the housing chamber and the electronic component side), and in order to facilitate the workability of the electronic component side in attaching and detaching with respect to the housing chamber (in other words, the workability of the engaging bodies in attaching and detaching), a certain play is provided between the engaging bodies that are in the engaged state. Thus, in the electrical connection box, in the case that the electronic component side is retained to the housing chamber only via such a retaining mechanism, there is a possibility that the connection strength between the housing chamber and the electronic component side is deteriorated when the vibration associated with the input from a road surface is transmitted via a vehicle body. In the above-described technology in JP-A-2001-186629, the one that is similar to the retaining mechanism is provided as a retaining mechanism of a fitting state between a box body and a lower cover and, by curving, in a depth direction, an opening side of walls of the lower cover on which engaging bodies are provided, it is designed to ensure the connection strength between the box body and the lower cover. In the technology disclosed in Japanese Patent No. 2882313, by clamping a substrate with supporting ribs provided on each of a lower case and an upper case, it is designed to ensure the connection strength between the case and the substrate.

SUMMARY OF THE INVENTION

An object of the present invention is to provide an electrical connection box and a wire harness that are capable of ensuring the connection strength between the housing chamber and the electronic component side.

In order to achieve the above mentioned object, an electrical connection box according to one aspect of the present invention includes a housing that includes a housing chamber into which an electronic component is accommodated and from which electrical wires are drawn out to outside when the electrical wires are electrically connected to the electronic component; and at least one retaining mechanism that is provided between a retaining wall that is one of a plurality of walls composing the housing chamber and the electronic component or a retaining member of the electronic component, and makes the housing chamber retain the electronic component or the retaining member, wherein the housing has openings at both ends and includes a main component in which at least one housing chamber communicating with the respective openings is formed, the retaining wall is made to warp toward the housing chamber side as compared with when the electronic component is in an accommodated state in which the retaining mechanism retains the electronic component or the retaining member in the housing chamber, first and second connecting walls that connect to the retaining wall out of the walls composing the housing chamber are made, at connecting portion sides connecting to the retaining wall, to tilt or warp toward the housing chamber side as compared with when the electronic component is in the accommodated state, and an amount of warp of the retaining wall is the amount that the retaining wall is able to press the electronic component or the retaining member against an opposing wall that is opposite to the retaining wall out of the walls composing the housing chamber when the electronic component is in the accommodated state.

According to another aspect of the present invention, in the electrical connection box, it is preferable that the retaining mechanism includes a first engaging body provided on the retaining wall, and a second engaging body that is provided on the electronic component or the retaining member and that engages with the first engaging body when the electronic component or the retaining member is accommodated in the housing chamber, the first engaging body includes a pressing portion that applies to the second engaging body a pressing force toward a direction of eliminating the warp of the retaining wall when the electronic component is in the accommodated state, and the second engaging body includes a receiving portion that receives the pressing force of the first engaging body when the electronic component is in the accommodated state.

According to still another aspect of the present invention, in the electrical connection box, it is preferable that the housing includes a first cover component that, by being fitted in an end portion of one opening side of outer walls of the main component, closes up the one opening, and a second cover component that, by being fitted in an end portion of the other opening side of the outer walls of the main component, closes up the other opening, the retaining wall composes a part of the outer walls of the main component, and is formed so as to deform in a direction of eliminating the warp to be in a shape that enables the first and the second cover components to be fitted in when the electronic component is in the accommodated state, and the first and the second connecting walls compose a part of the outer walls of the main component, and are formed so as to deform in a direction of eliminating the tilt or the warp to be in a shape that enables the first and the second cover components to be fitted in when the electronic component is in the accommodated state.

A wire harness according to still another aspect of the present invention includes an electronic component; electrical wires electrically connected to the electronic component; and an electrical connection box that includes a housing that includes a housing chamber into which the electronic component is accommodated and from which the electrical wires are drawn out to outside, and at least one retaining mechanism that is provided between a retaining wall that is one of a plurality of walls composing the housing chamber and the electronic component or a retaining member of the electronic component, and makes the housing chamber retain the electronic component or the retaining member, wherein the housing has openings at both ends and includes a main component in which at least one housing chamber communicating with the respective openings is formed, the retaining wall is made to warp toward the housing chamber side as compared with when the electronic component is in an accommodated state in which the retaining mechanism retains the electronic component or the retaining member in the housing chamber, first and second connecting walls that connect to the retaining wall out of the walls composing the housing chamber are made, at connecting portion sides connecting to the retaining wall, to tilt or warp toward the housing chamber side as compared with when the electronic component is in the accommodated state, and an amount of warp of the retaining wall is the amount that the retaining wall is able to press the electronic component or the retaining member against an opposing wall that is opposite to the retaining wall out of the walls composing the housing chamber when the electronic component is in the accommodated state.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

The following describes an exemplary embodiment of an electrical connection box and a wire harness according to the present invention in detail based on the accompanying drawings. The invention, however, is not intended to be limited by the embodiment.

Embodiment

One embodiment of the electrical connection box and the wire harness according to the invention will be described with reference to FIGS. 1 to 6.

Figure 1:
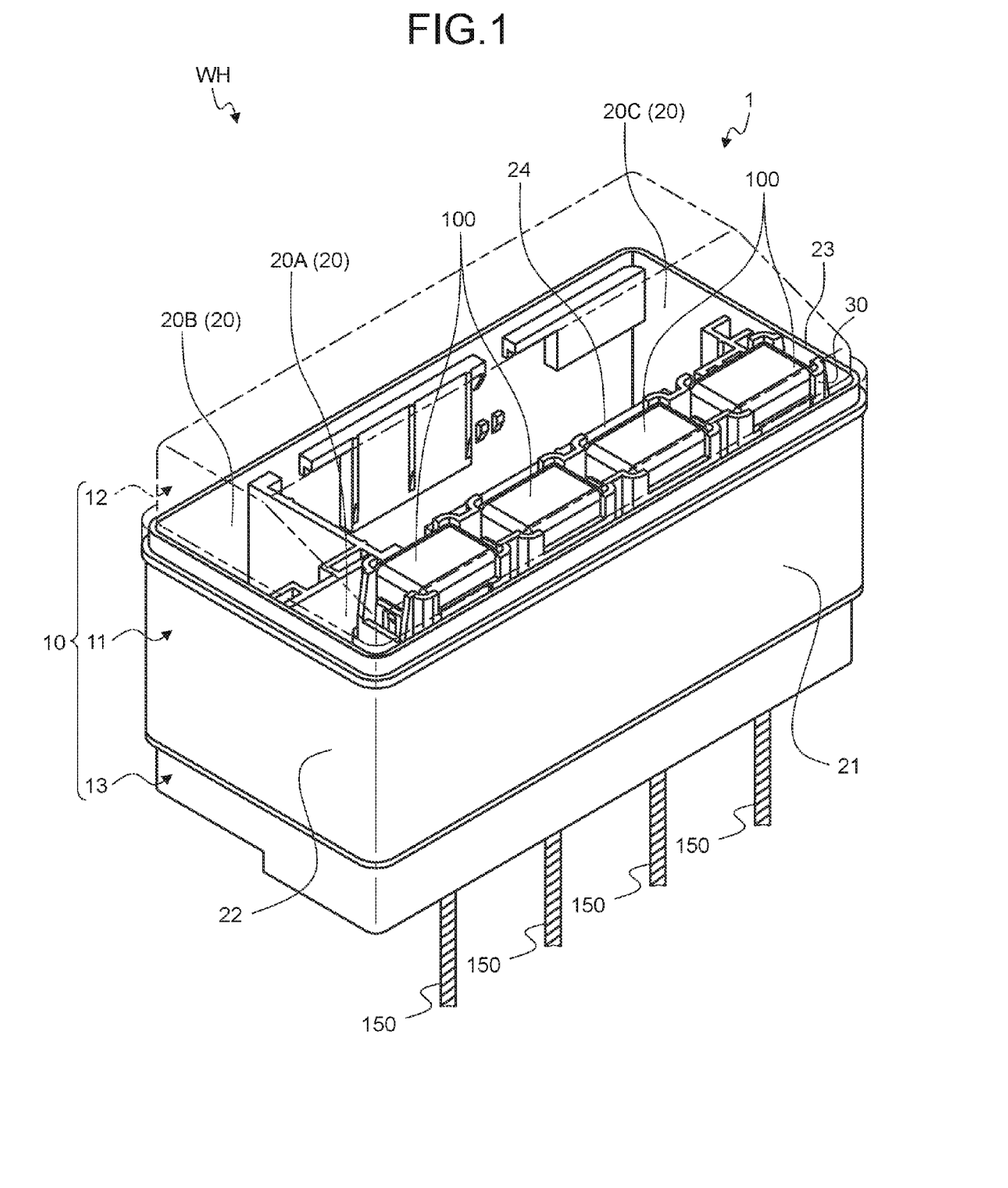
FIG. 1 is a perspective view illustrating an electrical connection box and a wire harness according to an embodiment.

The reference sign 1 in FIG. 1 represents an electrical connection box of the present embodiment. The reference sign WH in FIG. 1 represents a wire harness that includes the electrical connection box 1.

The electrical connection box 1 of the embodiment accommodates therein various electronic components 100 electrically connected to connection target objects such as a power source (depiction omitted), a load (depiction omitted), and a sensor (depiction omitted). The electronic components 100 mean, for example, relays, circuit protection components such as a fuse, and connectors. In the embodiment, electronic devices such as an electronic control unit (what is called an ECU) are also defined as the electronic components 100 accommodated in the electrical connection box 1. To the accommodated electronic components 100, appropriate electrical wires (power supply lines, signal lines, and others) 150 are electrically connected. In the electrical connection box 1, the electrical wires 150 are drawn out to the outside. The electrical connection box 1 composes the wire harness WH together with the electrical wires 150 and others. The wire harness WH is disposed in a vehicle and is connected to a power source (a secondary battery) side, an electrical equipment (an actuator and others) side as a load, and others via the electrical wires 150, for example.

Figure 2:
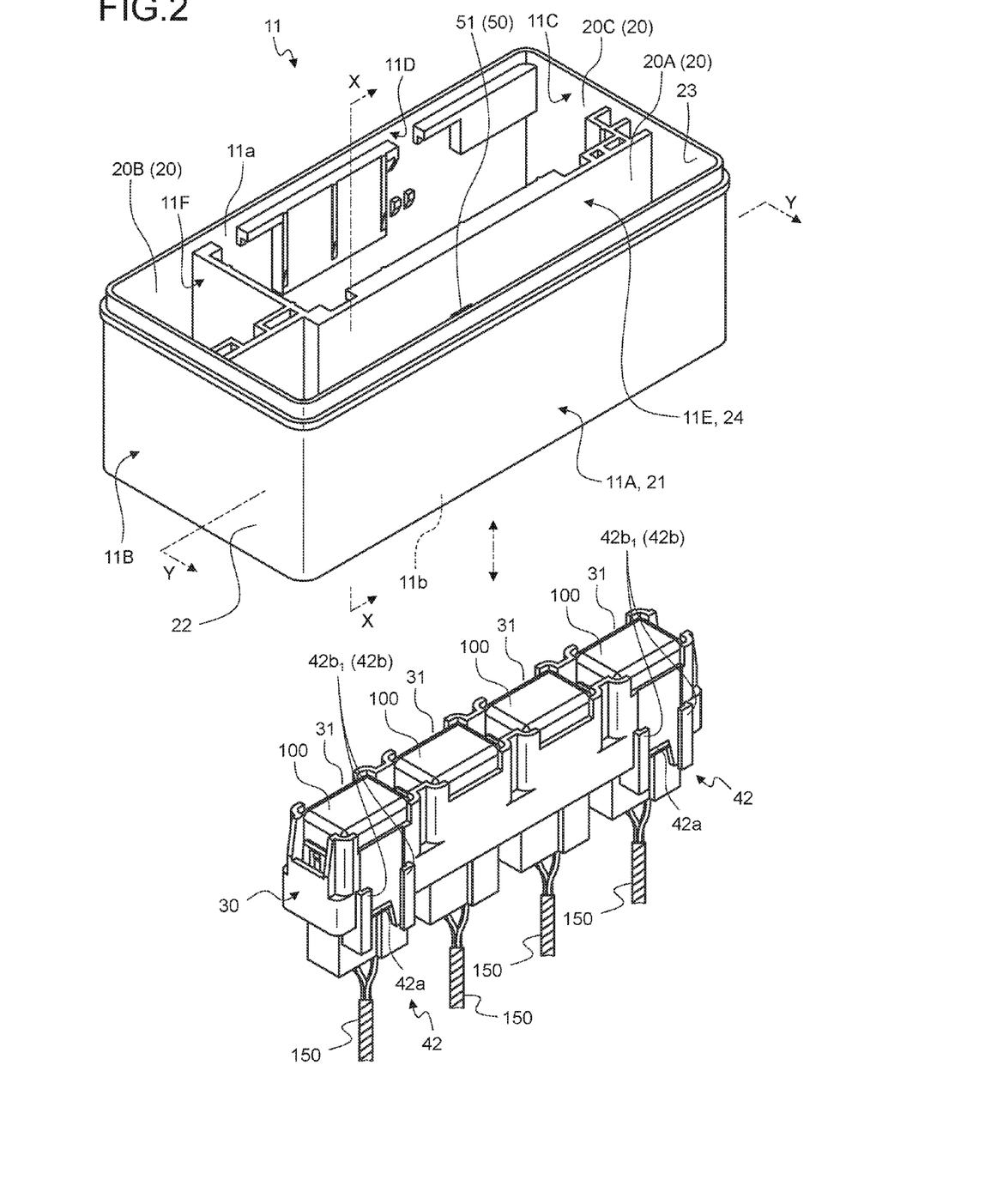
FIG. 2 is an exploded perspective view illustrating the relation of a main component and a retaining member.

The electrical connection box 1 of the embodiment includes a housing 10 that accommodates therein at least one of the electronic components 100 and from which the electrical wires 150 electrically connected to the electronic components 100 are drawn out to the outside. The housing 10 is molded with insulation material such as synthetic resin and has space that the electronic components 100 are accommodated in the inside. In the internal space, at least one of housing chambers 20 of the electronic components 100 is formed (FIGS. 1 and 2). In this example, first to third housing chambers 20A, 20B, and 20C are formed.

The housing 10 of the embodiment is formed with a plurality of constituent components. For example, the housing 10 of this example includes a main component 11, a first cover component 12, and a second cover component 13 (FIG. 1).

The main component 11 is used as a frame and is opened at both ends, and the respective openings (first and second openings 11a and 11b) communicate with each other via the internal space (FIG. 2). The main component 11 of this example is a tubular body for which outer walls are formed with first to fourth outer walls 11A, 11B, 11C, and 11D. In the main component 11, at least one housing chamber 20 communicating with the first and second openings 11a and 11b is formed. In the main component 11 of this example, first and second partition walls 11E and 11F are provided as inner walls, and with these first and second partition walls 11E and 11F, the first to the third housing chambers 20A, 20B, and 20C are formed.

The first cover component 12 is fitted in the end portion on the first opening 11a (one of the openings) side of the outer walls (the first to the fourth outer walls 11A, 11B, 11C, and 11D) of the main component 11, and closes up the first opening 11a along with fitting. The second cover component 13 is fitted in the end portion on the second opening 11b (the other of the openings) side of the outer walls of the main component 11, and closes up the second opening 11b along with fitting.

Although not depicted, between the main component 11 and the first cover component 12, and between the main component 11 and the second cover component 13, a retaining mechanism composed of an engaging body provided on one side and an engaging body provided on the other side is each provided. The retaining mechanism between the main component 11 and the first cover component 12 retains a fitting state of the main component 11 and the first cover component 12 by engaging the engaging bodies with each other. The retaining mechanism between the main component 11 and the second cover component 13 retains a fitting state of the main component 11 and the second cover component 13 by engaging the engaging bodies with each other. For example, each retaining mechanism has a claw portion on at least one of the two engaging bodies, and is formed as a locking mechanism that makes the engaging bodies lock by the claw portions catching each other, or by the claw portion catching an engaging portion of the engaging body of the other side.

In the housing 10, the housing chamber 20 (the first to the third housing chambers 20A, 20B, and 20C) is formed for each electronic component 100, or for each combination of a plurality of electronic components 100 (hereinafter referred to as an "electronic component group"). For example, when an electronic device such as an electronic control unit is an accommodating subject, in the housing chamber 20, the electronic device is directly accommodated. When an electronic component group is an accommodating subject, in the housing chamber 20, the electronic component group is indirectly accommodated via a retaining member 30 of the electronic components 100 which will be described later.

For example, the first housing chamber 20A is formed with a plurality of walls. In this example, it is formed with substantially rectangular first to fourth walls 21 to 24. The first wall 21 means the first outer wall 11A of the main component 11. The second wall 22 is formed with a part of the second outer wall 11B of the main component 11. The third wall 23 is formed with a part of the third outer wall 11C of the main component 11. The fourth wall 24 means the first partition wall 11E of the main component 11.

In the first housing chamber 20A, an electronic component group is accommodated. The respective electronic components 100 constituting the electronic component group are retained by the retaining member 30 and, in a state of being integrally combined by the retaining member 30, are accommodated together into the first housing chamber 20A (FIGS. 1 and 2). The retaining member 30 is molded with insulation material such as synthetic resin, and has space 31 that each electronic component 100 is accommodated and retained (hereinafter referred to as an "electronic-component housing chamber") in the inside thereof for each electronic component 100 (FIG. 2). In the electronic-component housing chamber 31, to the terminals (depiction omitted) of the electronic component 100, end portions of the electrical wires 150 are electrically connected. The electrical wires 150 are drawn out toward the outside from the retaining member 30. The retaining member 30 of this example is shaped in a rectangular parallelepiped for which the electronic-component housing chambers 31 are lined. The retaining member 30 may be referred to as a block.

Figure 3:
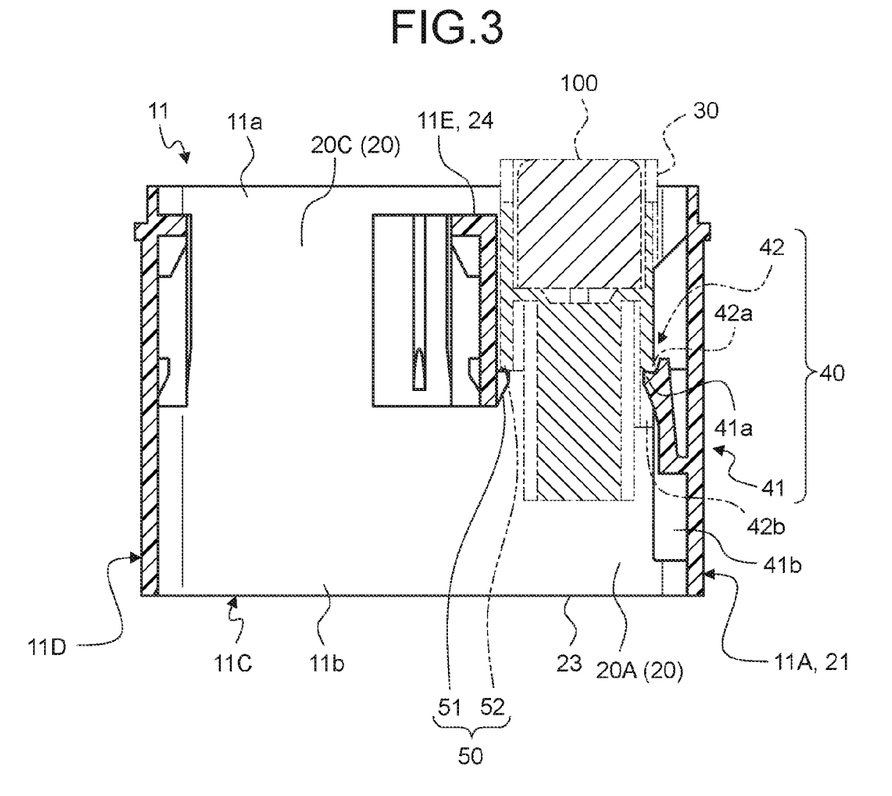
FIG. 3 is a cross-sectional view cut along the line X-X in FIG. 2.

In the electrical connection box 1, a retaining mechanism (hereinafter referred to as a "first retaining mechanism") 40 that retains the retaining member 30 in the first housing chamber 20A is provided (FIG. 3). The first retaining mechanism 40 is constructed such that the retaining member 30 is detachable with respect to the first housing chamber 20A, and at least one is provided between a retaining wall, which is one wall out of a plurality of walls constituting the first housing chamber 20A, and the retaining member 30. In this example, the first wall 21 is used as the retaining wall. Accordingly, in the following description, the first wall 21 is referred to as a "retaining wall 21".

The first retaining mechanism 40 includes a first engaging body 41 (FIGS. 3 and 4) provided on the retaining wall 21, and a second engaging body 42 (FIGS. 2 and 3) that is provided on the retaining member 30 and engages with the first engaging body 41 when the retaining member 30 is accommodated in the first housing chamber 20A. The first retaining mechanism 40 has a claw portion on at least one side out of the first engaging body 41 and the second engaging body 42, and is formed as a locking mechanism that makes the engaging bodies lock by the claw portions catching each other, or by the claw portion catching an engaging portion of the engaging body of the other side. In the first retaining mechanism 40 of this example, both the first engaging body 41 and the second engaging body 42 have claw portions 41a and 42a, respectively.

The retaining member 30 is inserted from the second opening 11b toward the first opening 11a, and is accommodated into the first housing chamber 20A. Accordingly, the respective claw portions 41a and 42a are formed such that they catch each other and engage with when the retaining member 30 reaches a certain position of the first housing chamber 20A along with the insertion, and such that the moving of the retaining member 30 toward the second opening 11b side can be restricted. On the first engaging body 41 and the second engaging body 42, provided are guide portions 41b and 42b that guide the retaining member 30 in the insertion direction with respect to the first housing chamber 20A. The respective guide portions 41b and 42b are ones like guide rails extending along the insertion direction, and are disposed at two places so as to sandwich the respective claw portions 41a and 42a. The guide portions 41b and 42b are formed such that the cross-section orthogonal to the insertion direction is L-shaped.

In this example, the first retaining mechanism 40 is provided at two locations. The two first retaining mechanisms 40 are disposed at locations that are close to each end portion (the end portions different from the first and the second openings 11a and 11b sides) of the retaining wall 21.

Moreover, in the electrical connection box 1, another retaining mechanism (hereinafter referred to as a "second retaining mechanism") 50 to retain the retaining member 30 in the first housing chamber 20A is provided (FIG. 3). The second retaining mechanism 50 is constructed such that the retaining member 30 is detachable with respect to the first housing chamber 20A, and at least one is provided between an opposing wall, which is opposite to the retaining wall 21 out of a plurality of walls constituting the first housing chamber 20A, and the retaining member 30. In this example, the fourth wall 24 is used as the opposing wall. Accordingly, in the following description, the fourth wall 24 is referred to as an "opposing wall 24". In this example, the second retaining mechanism 50 is provided at one location.

The second retaining mechanism 50 is formed as a locking mechanism that includes a claw portion provided on one side out of the opposing wall 24 and the retaining member 30, and an engaging portion that is provided on the other side and catches the claw portion and engages with it when the retaining member 30 is accommodated in the first housing chamber 20A. In this example, a claw portion 51 projecting toward the retaining wall 21 is provided on the opposing wall 24 and an engaging portion 52 is provided on the retaining member 30. The claw portion 51 and the engaging portion 52 are formed such that the claw portion 51 catches the engaging portion 52 and engages with it when the retaining member 30 reaches a certain position of the first housing chamber 20A along with the insertion of the retaining member 30 into the first housing chamber 20A, and such that the moving of the retaining member 30 toward the second opening 11b side can be restricted.

Meanwhile, the electrical connection box 1 is installed on a vehicle body, and thus the vibration associated with the input from a road surface is transmitted via the vehicle body. Thus, the electrical connection box 1 of the embodiment is constructed such that the engaging state (a locking state) of the first retaining mechanism 40 and the second retaining mechanism 50 is not weakened by such vibration and such that the connection strength between the first housing chamber 20A and the retaining member 30 is not deteriorated. Specifically, by forming the retaining wall 21 and forming first and second connecting walls, which connect to the retaining wall 21, out of a plurality of walls constituting the first housing chamber 20A, in the following manner, the connection strength between the first housing chamber 20A and the retaining member 30 is ensured. The first connecting wall means a wall (a part of the second outer wall 11B and the second wall 22) of the first housing chamber 20A connected to one end portion (an end portion different from the first and the second openings 11a and 11b sides) of the retaining wall 21 (FIGS. 1 and 2). The second connecting wall means a wall (a part of the third outer wall 11C and the third wall 23) of the first housing chamber 20A connected to the other end portion (an end portion different from the first and the second openings 11a and 11b sides) of the retaining wall 21. In the following description, the second wall 22 is referred to as a "first connecting wall 22" and the third wall 23 is referred to as a "second connecting wall 23".

Figure 5:
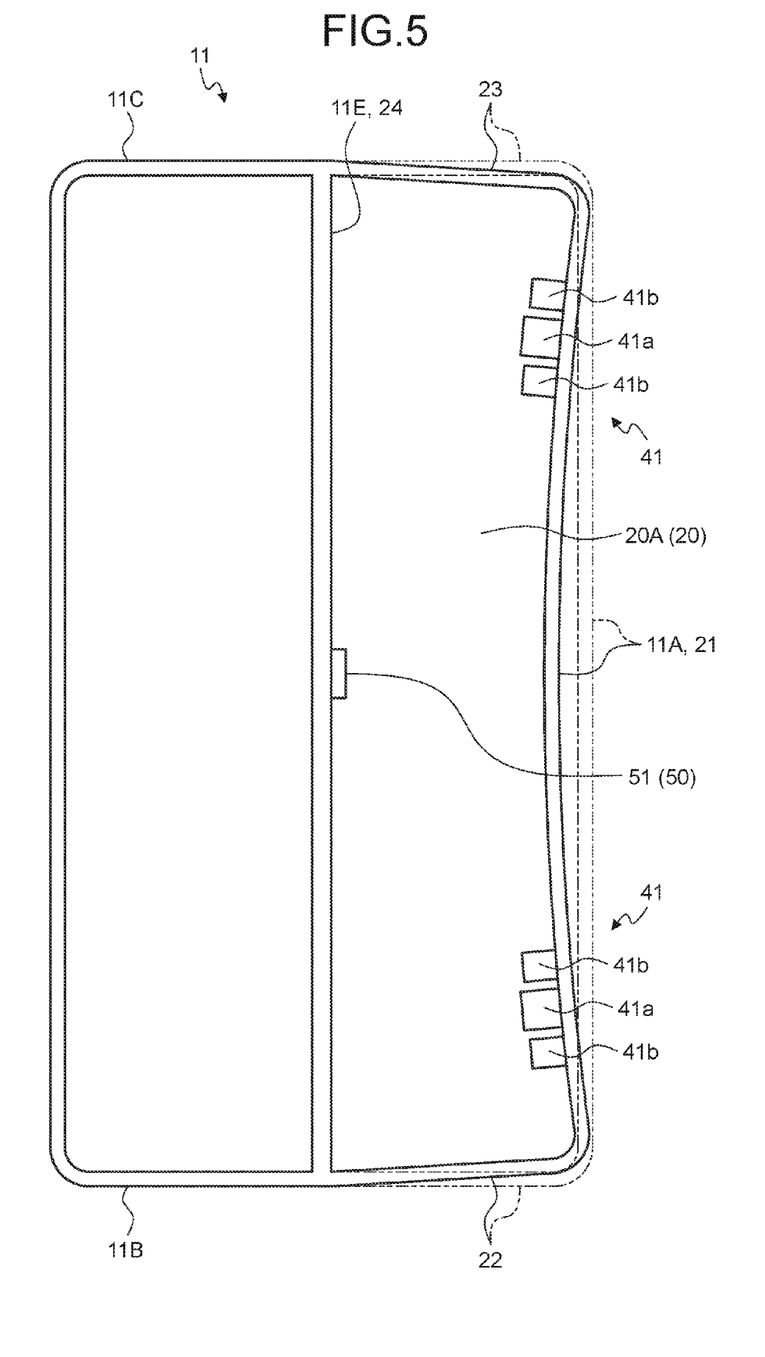
FIG. 5 is a conceptual diagram of the main component viewed from a first opening side and is illustrating the shape thereof before and after accommodating the retaining member.
Figure 6:
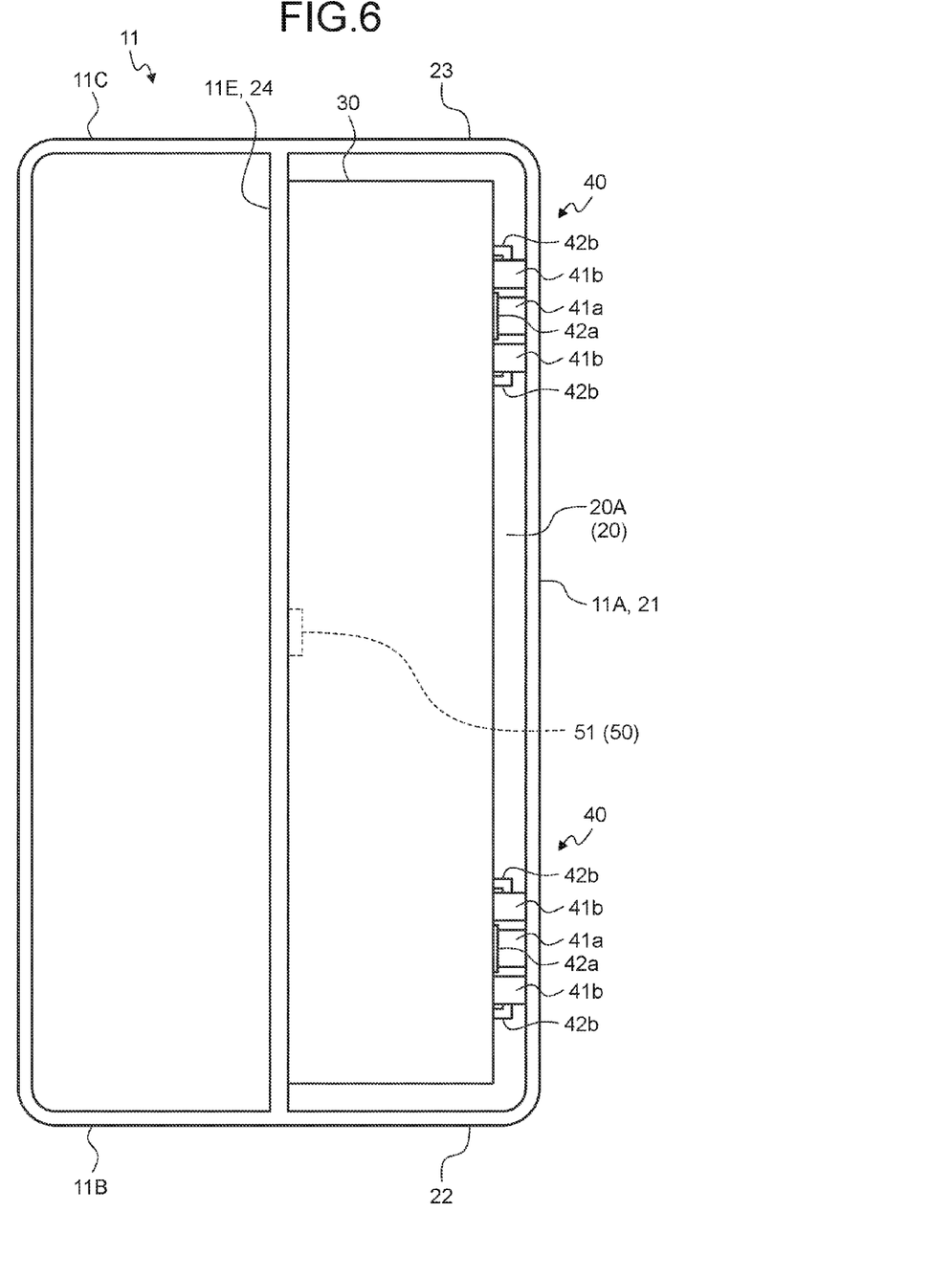
FIG. 6 is a conceptual diagram of the main component viewed from the first opening side and is illustrating an accommodated state of the retaining member.

The retaining wall 21 is made to warp toward the first housing chamber 20A side, as compared with when the electronic components 100 are in an accommodated state in which the retaining mechanisms (the first and the second retaining mechanisms 40 and 50) are retaining the retaining member 30 in the first housing chamber 20A (FIG. 5). Then, the retaining wall 21 is formed such that, when the electronic components 100 are in an accommodated state, it deforms in a direction of eliminating the warp by being pushed by the retaining member 30, and such that the amount of warp is made small. Because the retaining wall 21 composes a part of the outer wall of the main component 11, it is desirable that the warp of the retaining wall 21 be made small down to a position at which the fitness of the housing 10 (the fitness of the first cover component 12 and the second cover component 13 with respect to the retaining wall 21) is not impaired when the electronic components 100 are in an accommodated state (FIG. 6). Accordingly, the retaining wall 21 is formed such that, when the electronic components 100 are in an accommodated state, it deforms in a direction of eliminating the warp by being pushed by the retaining member 30, and is in a shape that enables the first cover component 12 and the second cover component 13 to be fitted in. Thus, the retaining wall 21 is made to have flexibility, by appropriately setting the thickness and shape, such that the shape can be changed before and after accommodating the electronic components 100. The amount of warp of the retaining wall 21 is the amount of changes in the region that changes the shape most, and represents the difference between the position at the time the electronic components 100 are in an accommodated state and the position that is before accommodating the electronic components 100. The amount of warp is made to be the amount that the retaining wall 21 is able to press the retaining member 30 against the opposing wall 24 when the electronic components 100 are in an accommodated state. In the retaining wall 21 in this example, a central portion is made to warp toward the first housing chamber 20A side than the opposing two end portions (the end portions different from the first and the second openings 11a and 11b sides). Thus, the amount of warp of the retaining wall 21 means the amount of changes in the shape in the central portion of the retaining wall 21.

In the electrical connection box 1, in order to enable the retaining wall 21 to press the retaining member 30 to the opposing wall 24, the minimum distance between the central portion of the retaining wall 21 and the opposing wall 24 before accommodating the electronic components 100 is made narrower than the physical size of the retaining member 30 that is in between them. Thus, in the electrical connection box 1, while pushing the retaining wall 21 in the direction of eliminating the warp with the retaining member 30, the retaining member 30 is accommodated in the first housing chamber 20A. Accordingly, in the electrical connection box 1, in order to make such pushing work possible, the end portion on the second opening 11b side of the opposing wall 24 is disposed at a deeper position than the end portion on the second opening 11b side of the retaining wall 21 (FIG. 3), such that, when accommodating the retaining member 30 into the first housing chamber 20A, the retaining member 30 and the electronic components 100 do not come in contact with the end portion on the second opening 11b side of the opposing wall 24. In this example, it is desirable that the end portion on the second opening 11b side of the opposing wall 24 be disposed at a position that such a contact does not occur until at least the engaging of the guide portions 41b and 42b of the first retaining mechanism 40 begins (that is, until the guide portion 42b of the retaining member 30 side is inserted to the guide portion 41b on the first housing chamber 20A side).

As in the foregoing, in the electrical connection box 1, by providing the retaining wall 21 that is warped toward the first housing chamber 20A side by a certain amount of warp, the retaining wall 21 is able to press the retaining member 30 against the opposing wall 24 when the electronic components 100 are in an accommodated state. Thus, in the electrical connection box 1, because the play (that is, relative movement) of the retaining member 30 with respect to the first housing chamber 20A is restrained, the engaging strength (locking strength) of the first and the second retaining mechanisms 40 and 50 can be ensured and the deterioration in connection strength between the first housing chamber 20A and the retaining member 30 can be suppressed.

Figure 4:
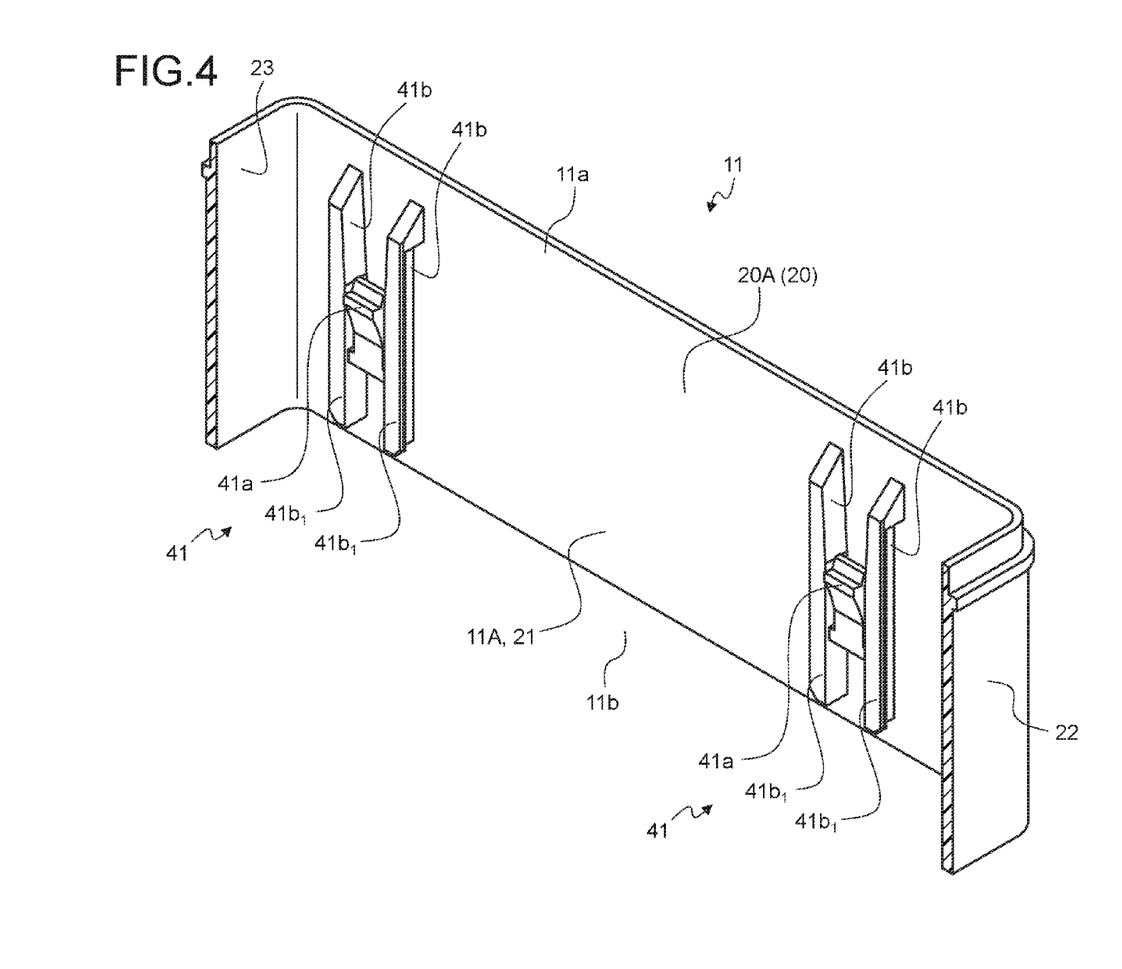
FIG. 4 is a diagram illustrating a cross-section cut along the line Y-Y in FIG. 2 as a perspective view.

In the electrical connection box 1, in order to ensure the connection strength, the first retaining mechanism 40 can be used. For example, on the first engaging body 41, provided is a pressing portion that applies to the second engaging body 42 a pressing force toward the direction of eliminating the warp of the retaining wall 21 when the electronic components 100 are in an accommodated state. Then, on the second engaging body 42, provided is a receiving portion that receives the pressing force of the first engaging body 41 when the electronic components 100 are in an accommodated state. In this example, a part of the guide portion 41b is used as a pressing portion 41$b_1$, and a part of the guide portion 42$b$ is used as a receiving portion 42$b_1$ (FIGS. 2 and 4). In the first retaining mechanism 40, when the electronic components 100 are in an accommodated state, by making the pressing portion 41$b_1$ exert a pressing force on the receiving portion 42$b_1$, a reaction force of the pressing force is exerted on the pressing portion 41$b_1$ from the receiving portion 42$b_1$. Accordingly, because the first retaining mechanism 40 generates a force of pulling each other between the first housing chamber 20A and the retaining member 30 when the electronic components 100 are in an accommodated state, the engaging strength (locking strength) is increased. Thus, in the electrical connection box 1, the connection strength between the first housing chamber 20A and the retaining member 30 can be increased.

When the electronic components 100 are in an accommodated state, the warp of the retaining wall 21 is decreased down to the position at which the first cover component 12 and the second cover component 13 can be fitted in. At that time, along with the deformation of the retaining wall 21, the first and the second connecting walls 22 and 23 also deform. That is, in the first and the second connecting walls 22 and 23, together with the deformation in the direction of eliminating the warp of the retaining wall 21, the connecting portion sides connecting to the retaining wall 21 are pushed with the two opposing end portions (end portions different from the first and second openings 11$a$ and 11$b$ sides) of the retaining wall 21. Thus, the first and the second connecting walls 22 and 23 are made to have flexibility, by appropriately setting the thickness and shape, such that the shape can be changed before and after accommodating the electronic components 100. Then, in the first and the second connecting walls 22 and 23, by taking into the consideration the deformation when the electronic components 100 are in an accommodated state, the connecting portion sides connecting to the retaining wall 21 are made to tilt or warp toward the first housing chamber 20A side, as compared with the accommodated state (FIG. 5).

For example, the first and the second connecting walls 22 and 23 compose a part of the outer walls of the main component 11. Thus, the first and the second connecting walls 22 and 23 are formed by determining the shape at the time of tilting or warping such that, when the electronic components 100 are in an accommodated state, they deform in the direction of eliminating the tilt or the warp and are in a shape that enables the first and second cover components 12 and 13 to be fitted in. Accordingly, the electrical connection box 1 can ensure the fitness of the housing 10 (the fitness of the first cover component 12 and the second cover component 13 with respect to the retaining wall 21), even when the retaining wall 21 is warped in order to ensure the connection strength between the first housing chamber 20A and the retaining member 30. Then, the electrical connection box 1 can also suppress the expansion of the physical size of the housing 10. Furthermore, when the first and the second connecting walls 22 and 23 are provided as inner walls of the main component 11, by making them tilt or warp toward the first housing chamber 20A side, even when the first and the second connecting walls 22 and 23 also serve as the walls of a separate housing chamber 20, the inner volume of the housing chamber 20 can be kept in a size capable of accommodating the electronic components 100, for example. As in the foregoing, by making the first and the second connecting walls 22 and 23 tilt or warp toward the first housing chamber 20A side, the electrical connection box 1 can suppress side effects on the peripheries of the first and the second connecting walls 22 and 23 while ensuring the connection strength between the first housing chamber 20A and the retaining member 30.

Moreover, it is desirable that the retaining wall 21 be formed such that it can be deformed to a shape that the warp is substantially eliminated (that is, the shape that the respective end portions on the first and the second openings 11$a$ and 11$b$ sides are in a substantially straight line) when the electronic components 100 are in an accommodated state. Then, it is desirable that the first and the second connecting walls 22 and 23 be formed such that they can be deformed to a shape that the tilt or the warp is substantially eliminated (that is, the shape that the respective end portions on the first and the second openings 11$a$ and 11$b$ sides of the second and the third walls 22 and 23 are in a substantially straight line) when the electronic components 100 are in an accommodated state. Accordingly, in the first cover component 12 and the second cover component 13, the portions engaging with the retaining wall 21 and with the first and the second connecting walls 22 and 23 do not need to be formed matching the warping shape and the like of the retaining wall 21. Thus, the electrical connection box 1 can improve the formability of the first cover component 12 and the second cover component 13, and improves the fitness of the housing 10.

As exemplified in the foregoing, the electrical connection box 1 of the embodiment can increase the connection strength between the first housing chamber 20A and the retaining member 30. Accordingly, because the retaining state of the retaining member 30 to the first housing chamber 20A can be kept regardless of the presence of the vibration transmitted from the vehicle body, the unnecessary load to the electronic components 100 and the electrical wires 150 can be restrained from being applied, and thus the electrical connection box 1 can improve the durability. Furthermore, because the retaining wall 21 and the first and the second connecting walls 22 and 23 are in the above-described shapes when the electronic components 100 are in an accommodated state, the electrical connection box 1 of the embodiment can ensure the fitness of the housing 10 while improving the durability. The wire harness WH according to the embodiment includes the foregoing electrical connection box 1, and thus it can have the effect of the electrical connection box 1.

Meanwhile, when an electronic device such as an electronic control unit is the accommodation target object to the first housing chamber 20A and the electronic component 100 is directly accommodated into the first housing chamber 20A, in the electrical connection box 1, by providing the second engaging body 42 on the electronic component 100 (for example, a case of the electronic component 100), the electronic component 100 only needs to compose the first retaining mechanism 40 that is directly retained in the first housing chamber 20A. The electrical connection box 1 and the wire harness WH in this case can increase the connection strength between the first housing chamber 20A and the electronic component 100, and thus the retaining state of the electronic component 100 into the first housing chamber 20A can be kept and the durability can be improved.

In the embodiment, a part of the outer walls of the main component 11 composes the first housing chamber 20A. However, the first housing chamber 20A may be formed only with inner walls such as partition walls. The electrical connection box 1 in this case, even with such a first housing chamber 20A, can increase the connection strength between the first housing chamber 20A and the electronic component 100 or the retaining member 30. Accordingly, the electrical connection box 1 and the wire harness WH in this case can, as the same as that of the foregoing example, improve the durability regardless of the presence of the vibration transmitted from the vehicle body.

In the electrical connection box according to the embodiments, by providing the retaining wall that is warped by a certain amount of warp, the retaining wall is able to press the retaining member against the opposing wall when the electronic components are in an accommodated state. Thus, in the electrical connection box, because the play (that is, relative movement) of the retaining member with respect to the housing chamber is restrained, the engaging strength (locking strength) of the retaining mechanism can be ensured and the deterioration in the connection strength between the housing chamber and the retaining member can be suppressed. Moreover, by making the first and the second connecting walls tilt or warp toward the housing chamber side, the electrical connection box can suppress the side effects (expansion of physical size and deterioration in fitness of the housing) on the peripheries of the first and the second connecting walls while ensuring the connection strength between the housing chamber and the retaining member. The wire harness according to the invention includes the electrical connection box, and thus the effect the same as that of the electrical connection box can be obtained.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
a housing that includes a retaining wall, first and second connecting walls, and an opposing wall that compose a housing chamber into which an electronic component is accommodated and from which electrical wires are drawn out to outside when the electrical wires are electrically connected to the electronic component; and
at least one retaining mechanism that is provided between the retaining wall and the electronic component or a retaining member of the electronic component, and makes the housing chamber retain the electronic component or the retaining member, wherein
the housing has openings at both ends and includes a main component in which at least one housing chamber communicating with the respective openings is formed,
the retaining wall is made to warp toward the housing chamber side before the electronic component is in an accommodated state in which the retaining mechanism retains the electronic component or the retaining member in the housing chamber,
the opposing wall is opposite to the retaining wall,
the first and second connecting walls connect the retaining wall to the opposing wall, the retaining wall extends from the first connecting wall to the second connecting wall such that connecting portion sides of the first and second connecting walls connecting to the retaining wall tilt or warp toward the housing chamber side before the electronic component is in the accommodated state, and
an amount of warp of the retaining wall is the amount that the retaining wall is able to press the electronic component or the retaining member against the opposing wall when the electronic component is in the accommodated state.

2. The electrical connection box according to claim 1, wherein
the retaining mechanism includes a first engaging body provided on the retaining wall, and a second engaging body that is provided on the electronic component or the retaining member and that engages with the first engaging body when the electronic component or the retaining member is accommodated in the housing chamber,
the first engaging body includes a pressing portion that applies to the second engaging body a pressing force toward a direction of eliminating the warp of the retaining wall when the electronic component is in the accommodated state, and
the second engaging body includes a receiving portion that receives the pressing force of the first engaging body when the electronic component is in the accommodated state.

3. The electrical connection box according to claim 2, wherein
the housing includes a first cover component that, by being fitted in an end portion of one opening side of outer walls of the main component, closes up the one opening, and a second cover component that, by being fitted in an end portion of the other opening side of the outer walls of the main component, closes up the other opening,
the retaining wall composes a part of the outer walls of the main component, and is formed so as to deform in a direction of eliminating the warp to be in a shape that enables the first and the second cover components to be fitted in when the electronic component is in the accommodated state, and
the first and the second connecting walls compose a part of the outer walls of the main component, and are formed so as to deform in a direction of eliminating the tilt or the warp to be in a shape that enables the first and the second cover components to be fitted in when the electronic component is in the accommodated state.

4. The electrical connection box according to claim 1, wherein
the housing includes a first cover component that, by being fitted in an end portion of one opening side of outer walls of the main component, closes up the one opening, and a second cover component that, by being fitted in an end portion of the other opening side of the outer walls of the main component, closes up the other opening,
the retaining wall composes a part of the outer walls of the main component, and is formed so as to deform in a direction of eliminating the warp to be in a shape that enables the first and the second cover components to be fitted in when the electronic component is in the accommodated state, and
the first and the second connecting walls compose a part of the outer walls of the main component, and are formed so as to deform in a direction of eliminating the tilt or the warp to be in a shape that enables the first and the second cover components to be fitted in when the electronic component is in the accommodated state.

5. The electrical connection box according to claim 1, wherein
the amount of warp of the retaining wall and an amount of tilt or warp of the first and second connecting walls provides a size of the housing chamber that is smaller than a corresponding physical size of the electronic component or the retaining member before the electronic component is in the accommodated state such that each of the retaining wall, the first connecting wall, and the second connecting wall deform away from the housing chamber side when the electronic component is in the accommodated state.

6. A wire harness comprising:

an electronic component;

electrical wires electrically connected to the electronic component; and an electrical connection box that includes a housing that includes a retaining wall, first and second connecting walls, and an opposing wall that compose a housing chamber into which the electronic component is accommodated and from which the electrical wires are drawn out to outside, and at least one retaining mechanism that is provided between the retaining wall and the electronic component or a retaining member of the electronic component, and makes the housing chamber retain the electronic component or the retaining member, wherein the housing has openings at both ends and includes a main component in which at least one housing chamber communicating with the respective openings is formed, the retaining wall is made to warp toward the housing chamber side before the electronic component is in an accommodated state in which the retaining mechanism retains the electronic component or the retaining member in the housing chamber, the opposing wall is opposite to the retaining wall, the first and second connecting walls connect the retaining wall to the opposing wall, the retaining wall extends from the first connecting wall to the second connecting wall such that connecting portion sides of the first and second connecting walls connecting to the retaining wall tilt or warp toward the housing chamber side before the electronic component is in the accommodated state, and an amount of warp of the retaining wall is the amount that the retaining wall is able to press the electronic component or the retaining member against the opposing wall when the electronic component is in the accommodated state.

7. The electrical connection box according to claim 6, wherein the amount of warp of the retaining wall and an amount of tilt or warp of the first and second connecting walls provides a size of the housing chamber that is smaller than a corresponding physical size of the electronic component or the retaining member before the electronic component is in the accommodated state such that each of the retaining wall, the first connecting wall, and the second connecting wall deform away from the housing chamber side when the electronic component is in the accommodated state.

\* \* \* \* \*